(12) United States Patent
Ryu

(10) Patent No.: US 7,309,652 B2
(45) Date of Patent: Dec. 18, 2007

(54) METHOD FOR REMOVING PHOTORESIST LAYER AND METHOD FOR FORMING METAL LINE IN SEMICONDUCTOR DEVICE USING THE SAME

(75) Inventor: Sang-Wook Ryu, Chungcheongbuk-do (KR)

(73) Assignee: MagnaChip Semiconductor, Ltd. (KR)

( * ) Notice: Subject to any disclaimer, the term of this patent is extended or adjusted under 35 U.S.C. 154(b) by 107 days.

(21) Appl. No.: 11/146,538

(22) Filed: Jun. 6, 2005

(65) Prior Publication Data

US 2006/0128151 A1   Jun. 15, 2006

(30) Foreign Application Priority Data

Dec. 9, 2004   (KR) ............... 10-2004-0103720

(51) Int. Cl.
H01L 21/47   (2006.01)
(52) U.S. Cl. ............... 438/689; 438/586; 438/710; 438/591; 438/722; 438/738; 216/12; 216/41
(58) Field of Classification Search ............... 438/689; 216/12
See application file for complete search history.

(56) References Cited

U.S. PATENT DOCUMENTS

| 5,747,116 A * | 5/1998 | Sharan et al. ............... 427/534 |
| 7,012,027 B2 * | 3/2006 | Perng et al. ............... 438/710 |
| 2004/0127001 A1 * | 7/2004 | Colburn et al. ............ 438/586 |
| 2004/0178169 A1 * | 9/2004 | Desphande et al. ........... 216/12 |

FOREIGN PATENT DOCUMENTS

| KR | 1998-54502 | 9/1998 |
| KR | 100226793 | 7/1999 |
| KR | 100230397 B1 | 8/1999 |

OTHER PUBLICATIONS

S.Park, Journal of Vacuum Science & Technology, vol. B 19(5), Sep./Oct. 2001, pp. 1841-1844.*
S. Wolf, Silicon Processing for the VLSI Era, vol. 4, Lattice Press (2002), pp. 639, 650 and 651.*
S. Wolf, Silicon Processing for the VLSI Era, vol. 1, Lattice Press (1986), pp. 183-184.*
Sang Wook Ryu et al., "Evaluation of Low Damage Ashing in Inductively Coupled Plasma for Cu/Low-ki damascene patterning", Advanced Metallization Conference (AMC) 2004, Oct. 19-21, 2004, San Diego, California (3 pages, including cover sheet).

* cited by examiner

Primary Examiner—Binh X. Tran
Assistant Examiner—Maki Angadi
(74) Attorney, Agent, or Firm—Blakely, Sokoloff, Taylor & Zafman

(57) ABSTRACT

Disclosed are a method for removing a photoresist layer and a method for forming a metal line using the same. The method for removing a photoresist pattern, including the steps of: forming a bottom layer on a substrate by using the photoresist pattern as a mask; and removing the photoresist pattern with use of a high density plasma (HDP) apparatus. The method for forming a metal line, including the steps of: preparing a semi-finished substrate including an inter-layer insulation layer; forming a photoresist pattern on the inter-layer insulation layer; forming an opening by etching the inter-layer insulation layer with use of the photoresist pattern as an etch mask; removing the photoresist pattern by using a high density plasma (HDP) apparatus; and forming the metal line by filling the opening with a predetermined material.

17 Claims, 18 Drawing Sheets

METHOD FOR REMOVING PHOTORESIST LAYER AND METHOD FOR FORMING METAL LINE IN SEMICONDUCTOR DEVICE USING THE SAME

FIELD OF THE INVENTION

The present invention relates to a method for removing a photoresist layer and a method for forming a metal line in a semiconductor device using the same; and, more particularly, to a method for removing a photoresist layer in a semiconductor device including a low-k dielectric layer etched by using the photoresist layer and a method for forming a metal line in a semiconductor device using the same.

DESCRIPTION OF RELATED ARTS

In semiconductor device fabrication processes, a patterning process, which is one essential fabrication process, adopts a wet etching process or a dry etching process using a photoresist pattern of which main component is carbon as an etch mask. After the etching process, the photoresist pattern is removed by a strip process. Generally, the strip process is carried out by using a solution containing hydrogen peroxide ($H_2O_2$), sulfuric acid ($H_2SO_4$) or the like, or a gas such as oxygen ($O_2$), nitrogen ($N_2$), hydrogen ($H_2$) or the like. However, when $O_2$ gas reacts with carbons contained in the photoresist pattern, volatile byproducts are produced, and through this reaction, the photoresist pattern is removed. In this case, the reaction takes place at a temperature above 200° C. to lower the activation energy when the $O_2$ gas reacts with the carbons, so that the reaction takes place more easily.

The above described patterning process is essentially applied for a metal line process. The metal line process is carried out by first patterning an insulation layer and filling an etch portion with a metal-based material. Currently, for the metal line process, a damascene process using copper is proposed to reduce resistance-capacitance (RC) delay mainly in logic devices requiring a large scale of integration and a high performance level, for instance, a logic device with a gate line width below 0.13 μm. Also, a low-k dielectric material is used as an insulation layer.

For the low-k dielectric material, such materials as fluorinated silicate glass (FSG) and organosilicate glass (OSG) where fluorine or carbon atoms are locally combined with molecules of $SiO_2$ are commonly used. The FSG layer is thermally stable even when the photoresist strip process is performed at a temperature of 200° C. by using the $O_2$ gas. On the other hand, the OSG layer is easily oxidized because of weak thermal stability when the photoresist strip process is performed at a temperature above 200° C. by using the $O_2$ gas.

More particularly, the OSG layer is advantageous to decrease a dielectric constant to a range of 2.2 as silicon-oxygen-methane bonds or silicon-oxygen-carbon bonds are incorporated partially into carbon-oxygen bonds or co-exist with the carbon-oxygen bonds. However, as mentioned above, the OSG layer is prone to oxidization because of the $O_2$ gas used during the photoresist strip process and as a result, the OSG layer is transformed into a silicon oxide layer, increasing the dielectric constant. The reaction mechanism of the aforementioned representative materials is defined as follows.

$$2SiOCH_3 + 3O_2 \rightarrow 2SiO_2 + 2CO_2 + 3H_2 \qquad \text{Eq. 1}$$

Therefore, it is necessary to decrease an amount of the $O_2$ gas used in the photoresist strip process, or to use other substitute gas such as nitrogen ($N_2$), $H_2$ or helium (He) for the photoresist strip process. However, in both cases, a removal rate of the photoresist pattern is reduced and also, remaining impurities such as organic remnants are removed in a slower rate. Therefore, reliability of semiconductor devices may be reduced.

SUMMARY OF THE INVENTION

It is, therefore, an object of the present invention to provide a photoresist removal method capable of improving device characteristics by decreasing an oxidation rate of a low-k dielectric layer formed beneath a photoresist pattern during a photoresist strip process.

It is another object of the present invention to provide a method for forming a metal line capable of improving device reliability by decreasing resistance-capacitance delay through employing the photoresist removal method.

In accordance with an aspect of the present invention, there is provided a method for removing a photoresist pattern, including the steps of: forming a bottom layer on a substrate by using the photoresist pattern as a mask; and removing the photoresist pattern with use of a high density plasma (HDP) apparatus.

In accordance with another aspect of the present invention, there is provided a method for forming a metal line, including the steps of: preparing a semi-finished substrate including an inter-layer insulation layer; forming a photoresist pattern on the inter-layer insulation layer; forming an opening by etching the inter-layer insulation layer with use of the photoresist pattern as an etch mask; removing the photoresist pattern by using a high density plasma (HDP) apparatus; and forming the metal line by filling the opening with a predetermined material.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, preferred embodiments of the present invention will be described in detail with reference to the accompanying drawings.

A method for removing a photoresist pattern in accordance with a first embodiment of the present invention is carried out by employing a high density plasma (HDP) dry etching process. The HDP dry etching process executes the etching by using ionized gaseous particles. In more detail of this HDP dry etching process, an etch source gas is provided to a chamber and then, a layer adsorbed onto a surface of a wafer is removed by controlling those ionized gaseous particles and radicals produced by applying a source power and a bias power.

For realization of the HDP dry etching process, an apparatus for the HDP with a density of at least approximately $5\times10^8/cm^3$ to approximately $5\times10^{13}/cm^3$ is used. The HDP apparatus includes an electron cyclotron resonance (ECR) plasma reactor, a helicon plasma reactor using a helical or whistler wave, a helical resonator plasma reactor, and an inductively coupled plasma (ICP) reactor. A decoupled plasma source (DPS) reactor and a transformer coupled plasma (TCP) reactor could also be classified as the ICP source.

Figure 1:
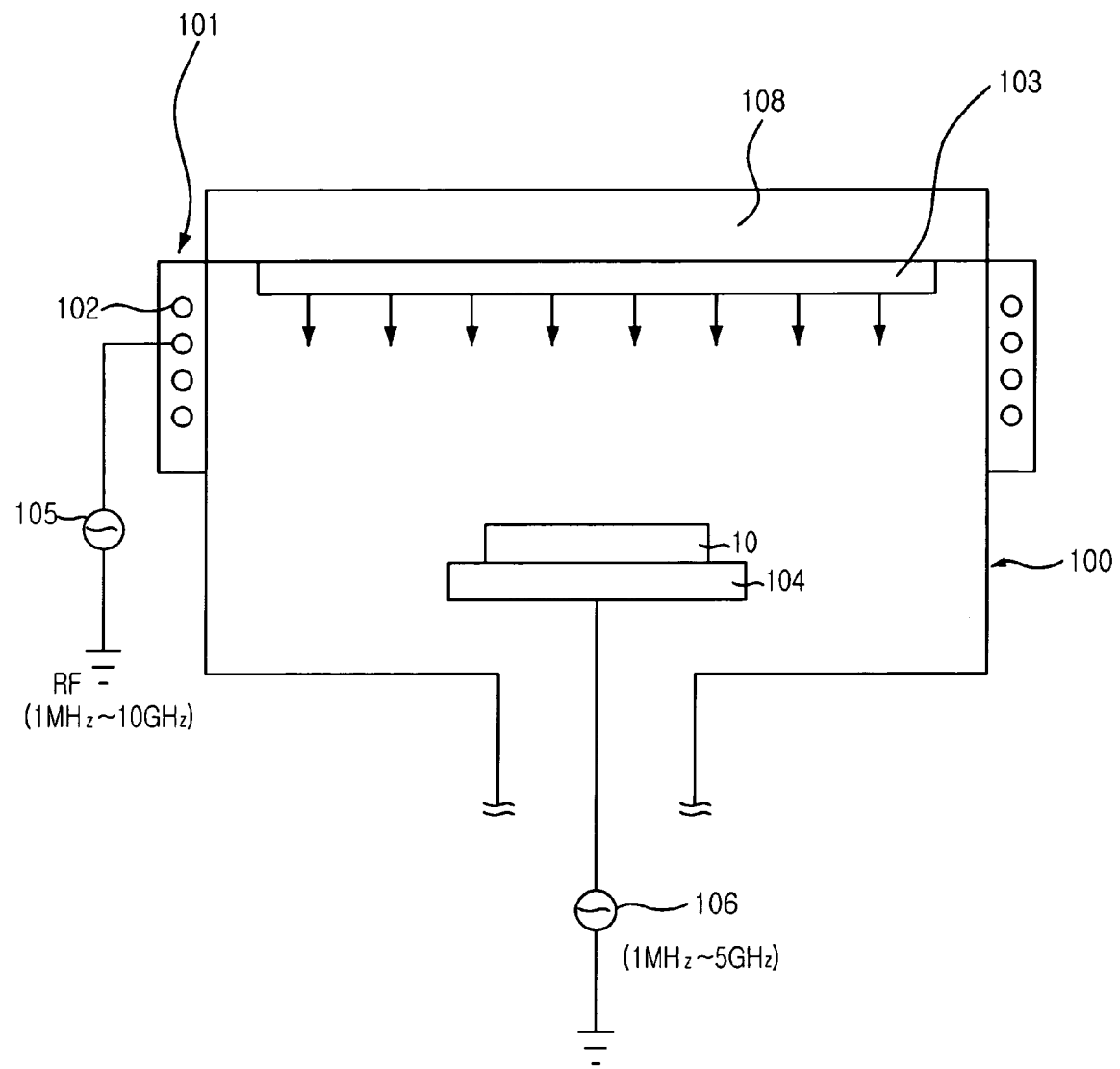
FIG. 1 is a diagram showing a high density plasma (HDP) apparatus used for a photoresist removal process in accordance with a first embodiment of the present invention.

FIG. 1 is a diagram showing an ICP reactor in which the photoresist removal method is applied. It should be noted that this ICP reactor is merely illustrative without limiting the application of present invention to other types of the HDP apparatus.

As shown, the ICP reactor includes a chamber 100. A top electrode assembly 101 formed by using an inductive antenna coil 102 is placed at the lateral side of the chamber 100. The inductive antenna coil 102 is applied with a source power from a first radio frequency (RF) generation unit 105. Also, inside of the chamber 100, a plate 103 for providing a gas into the chamber 100 is placed. The etch source gas can be provided through a port constructed on both sidewalls or on a top part of the chamber 100. A chuck 104 on which the wafer 10 is mounted is placed at the bottom side of the chamber. The chuck 104 functions as a bottom electrode and is provided with a bias power from a second RF generation unit 106.

Hereinafter, a first embodiment of the present invention with respect to a photoresist strip process using the above described ICP reactor will be described in detail. Herein, a photoresist layer is used for patterning a bottom layer by using the ICP reactor. At this time, the bottom layer includes organosilicate glass (OSG) widely used as a low-k dielectric material. Also, it should be noted that the same reference numerals are used for the same configuration elements even in different drawings.

Figure 2:
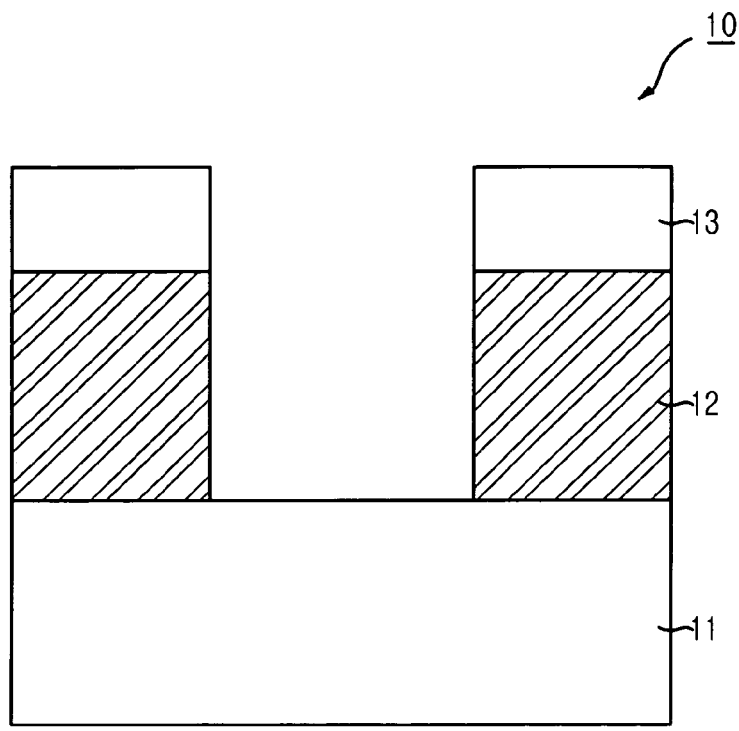
FIG. 2 is a cross-sectional view of an enlarged wafer shown in FIG. 1.

As shown in FIG. 2, the wafer 10 is loaded into the chamber 100. At this time, the chamber 100 is maintained with a low pressure ranging from approximately 1 mmtorr to 1,000 mmtorr and a low temperature ranging from approximately −20° C. to approximately 200° C. Under the state that the wafer 10 is mounted on the chuck 104, an etch gas is provide into the chamber 100 through the plate 103. At this time, the etch gas is selected from a group consisting of oxygen ($O_2$) gas, nitrogen ($N_2$) gas and hydrogen ($H_2$) gas, and if the $O_2$ gas is selected, an amount of the $O_2$ gas provided into the chamber 100 ranges from approximately 10 sccm to approximately 300 sccm. While the etch gas, in this case, the $O_2$ gas, is supplied, a source power of approximately 100 W to approximately 3,000 W is supplied through the first RF generation unit 105, thereby producing $O_2$ plasma at a region of the chamber 100 disposed between the plate 103 and the wafer 10. At this time, the RF is set to be in a range from approximately 1 MHz to 10 GHz.

Afterwards, a bias power of approximately 0 W to approximately 1,000 W is supplied to the chuck 104 through the second RF generation unit 106 causing ions of the $O_2$ plasma, i.e., $O_x$ ions, where x ranges from approximately 1 to approximately 3, to collide to a surface of the wafer 10, more particularly, to a photoresist pattern 13. At this time, the RF ranges from approximately 1 MHz to approximately 5 GHz.

Figure 3:
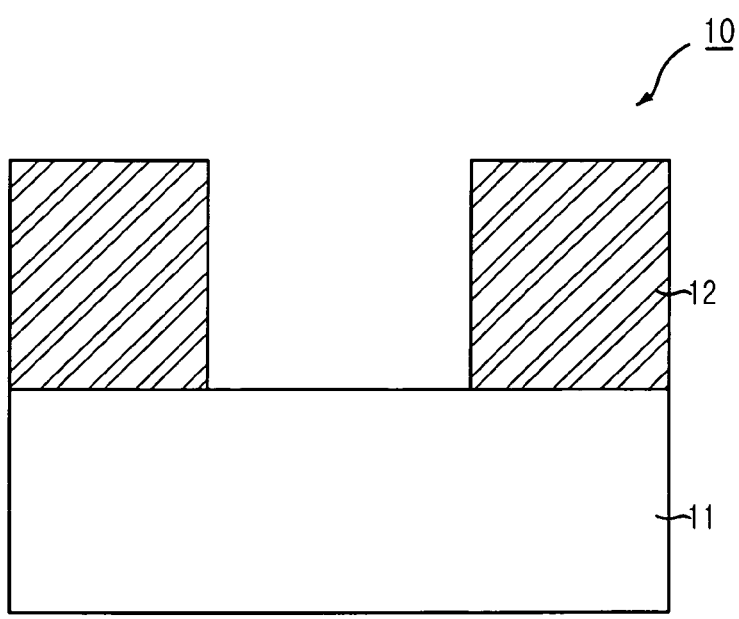
FIG. 3 is a cross-sectional view of an enlarged wafer subjected to the photoresist removal process described in FIG. 1.

Next, as shown in FIG. 3, once the photoresist pattern 13 is removed, a purge process is carried out to exhaust unnecessary gaseous particles out of the chamber 100.

Under the above process recipe, the photoresist pattern 13 can be stably removed with minimizing the oxidation of the bottom layer 12. Also, with the application of the first embodiment, those parameters affecting the oxidation of the bottom layer 12, i.e., the OSG layer are carefully studied as follows.

First, when the bias power is increasingly supplied to the chuck 104 while the pressure and the temperature of a chamber roof 108 are fixed, it is discovered that the bottom layer 12 is increasingly oxidized.

Second, when only the temperature is increased while the rest parameters are fixed, the bottom layer 12 is increasingly oxidized.

Hereinafter, a degree of the oxidation of the bottom layer depending on parameters such as a pressure and a temperature will be described. As mentioned above, the bottom layer is an OSG layer.

Figure 4B:
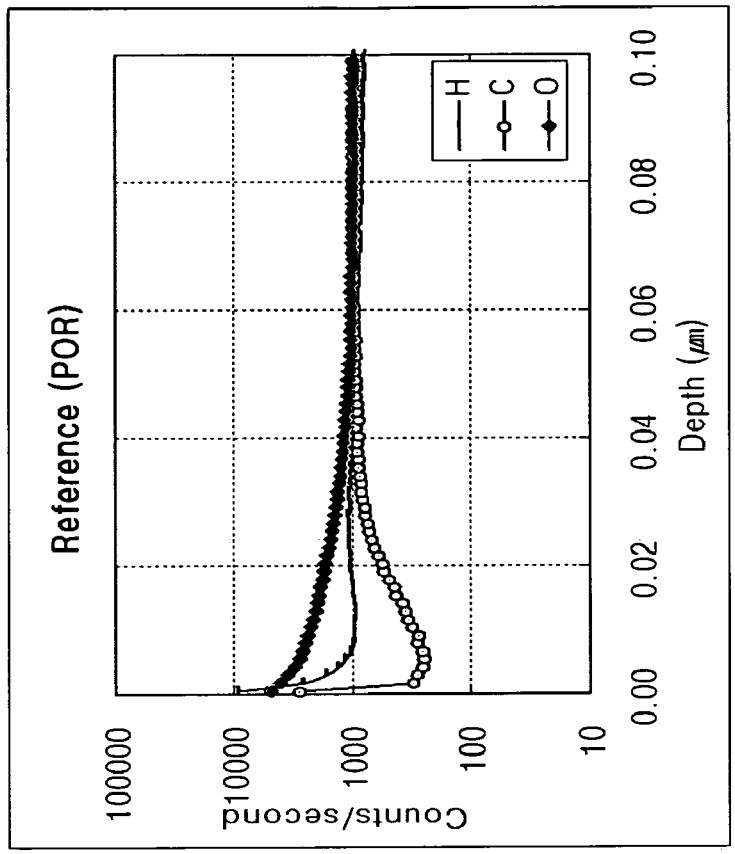
FIGS. 4A and 4B are respective micrographs of transmission electron microscopy (TEM) and secondary ion mass spectroscopy (SIMS) showing an oxidation degree of an OSG layer under a reference pressure and temperature in accordance with the present invention.
Figure 4A:
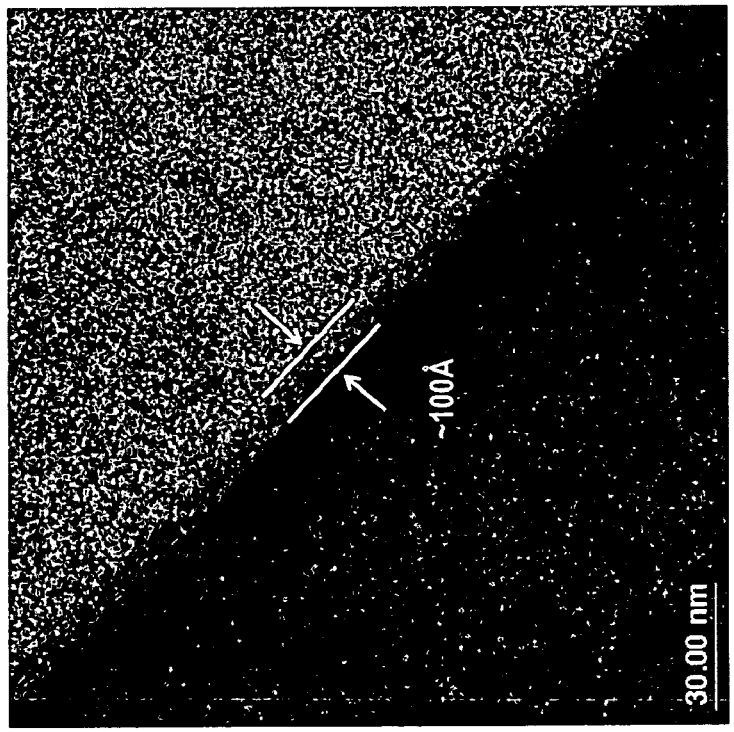

FIGS. 4A and 4B are respective micrographs of transmission electron microscopy (TEM) and secondary ion mass spectroscopy (SIMS) showing an oxidation degree of the OSG layer under a reference temperature and a pressure.

Figures 5A, 5B:
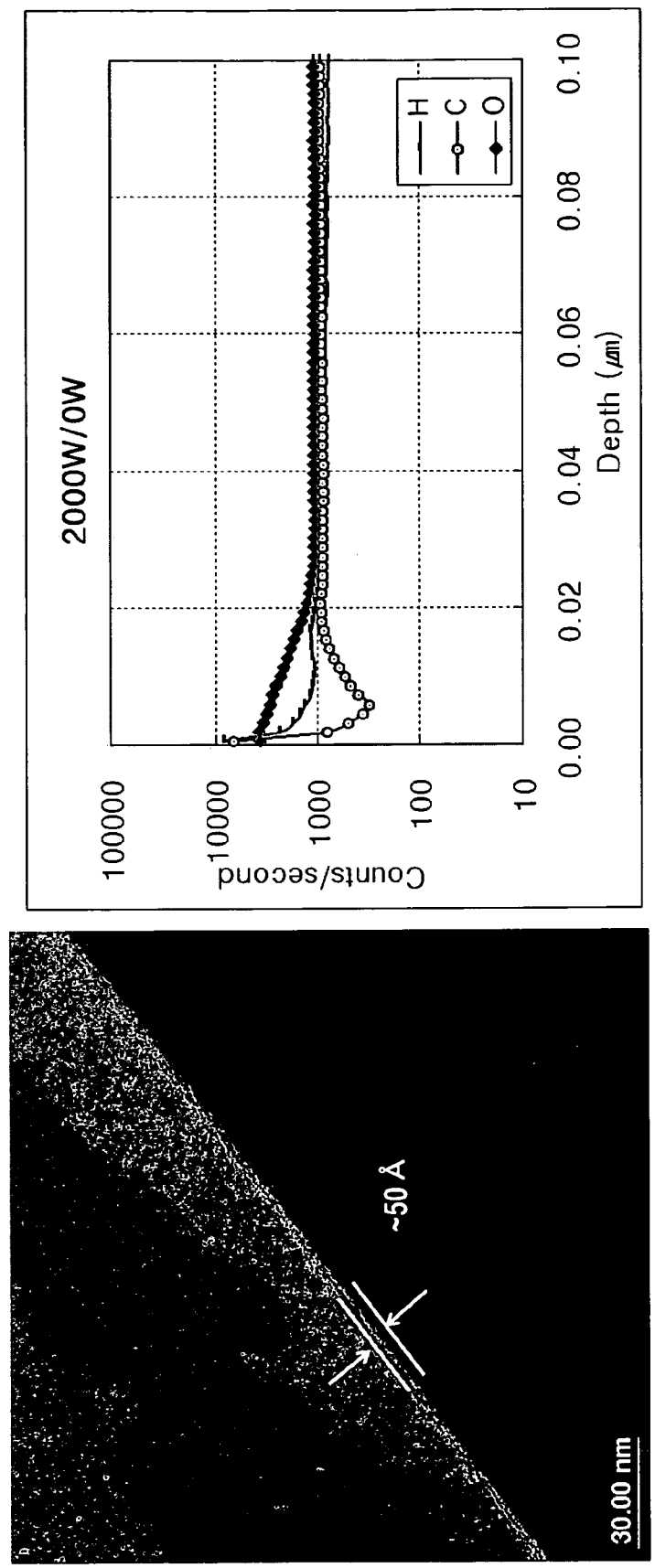
FIGS. 5A and 5B are respective micrographs of TEM and SIMS showing an oxidation degree of an OSG layer when a source power of approximately 2,000 W and a bias power of approximately 0 W are supplied while an inner chamber pressure and temperature are uniformly maintained in accordance with the present invention.
Figure 6B:
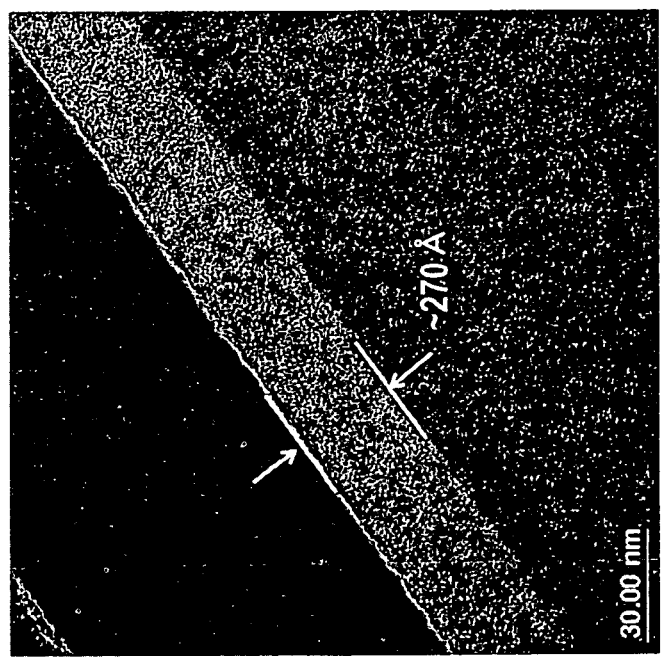
FIGS. 6A and 6B are respective micrographs of TEM and SIMS showing an oxidation degree of an OSG layer when a source power of approximately 2,400 W and a bias power of approximately 300 W are supplied while the inner chamber pressure and temperature are uniformly maintained in accordance with the present invention.
Figure 6A:
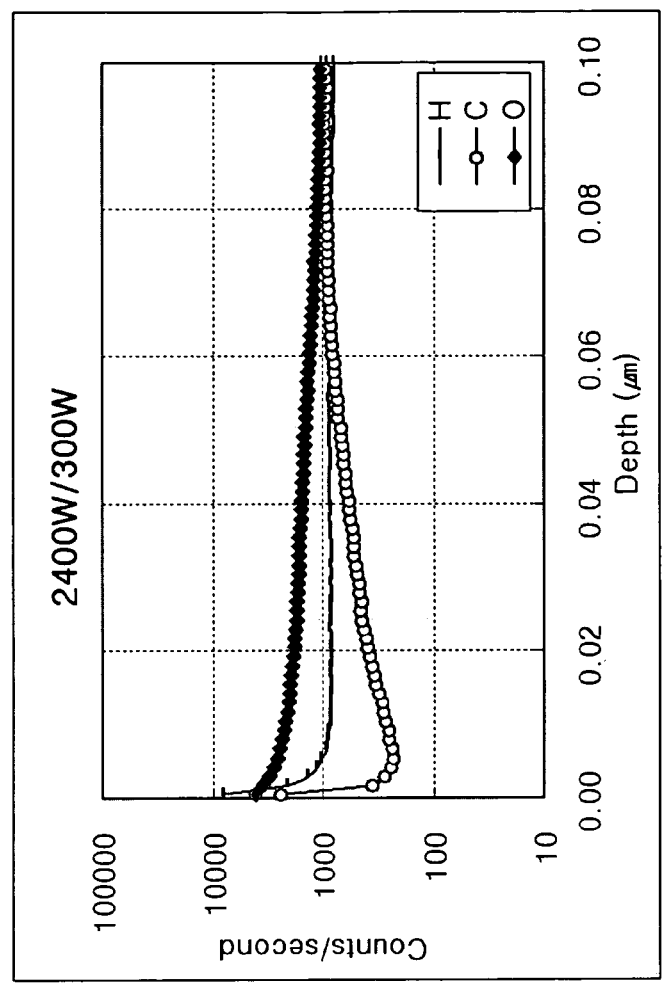

FIGS. 5A and 5B are respective micrographs of TEM and SIMS showing an oxidation degree of the OSG layer when a source power of approximately 2,000 W and a bias power of approximately 0 W are supplied while the inner chamber pressure and temperature are uniformly maintained. Also, FIGS. 6A and 6B are respective micrographs of TEM and SIMS showing an oxidation degree of the OSG layer when a source power of approximately 2,400 W and a bias power of approximately 300 W are supplied while the inner chamber pressure and temperature are uniformly maintained.

Especially, as shown in FIG. 5A, when the source power of approximately 2,000 W and the bias power of approximately 0 W are applied, an oxidized thickness of the OSG layer is approximately 50 Å. When the source power of approximately 2,400 W and the bias power of approximately 300 W are applied as shown in FIG. 6A, an oxidized thickness of the OSG layer is approximately 270 Å. In consideration of these parameters, the oxidized thickness of the OSG layer increases in proportion to the supplied source power and bias power.

Figure 7A:
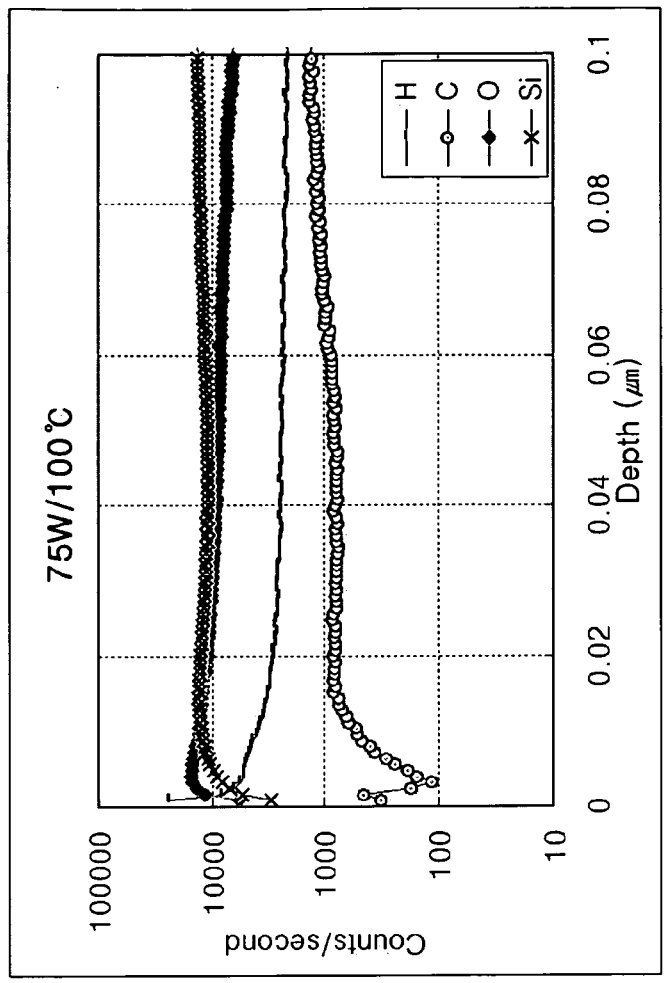
FIGS. 7A and 7B are respective micrographs of TEM and SIMS obtained when a chamber temperature is approximately 100° C. while a bias power of the inner chamber is maintained at approximately 75 W in accordance with the present invention.
Figure 7B:
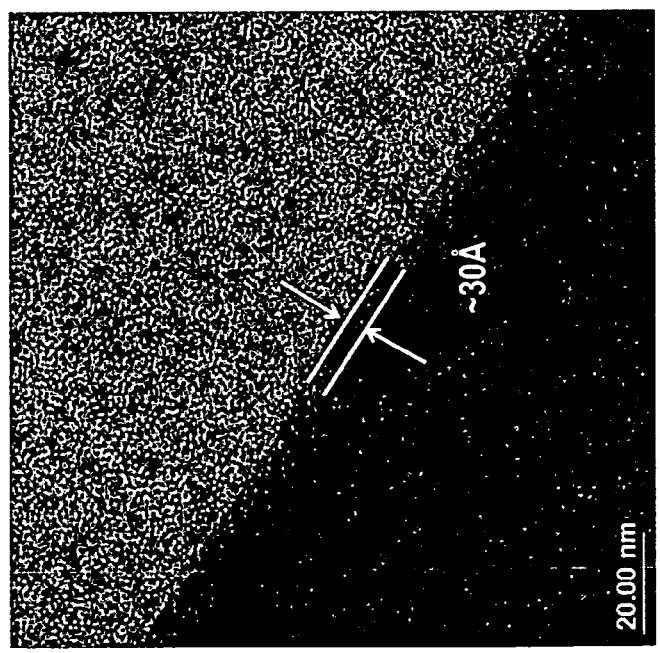
Figure 8B:
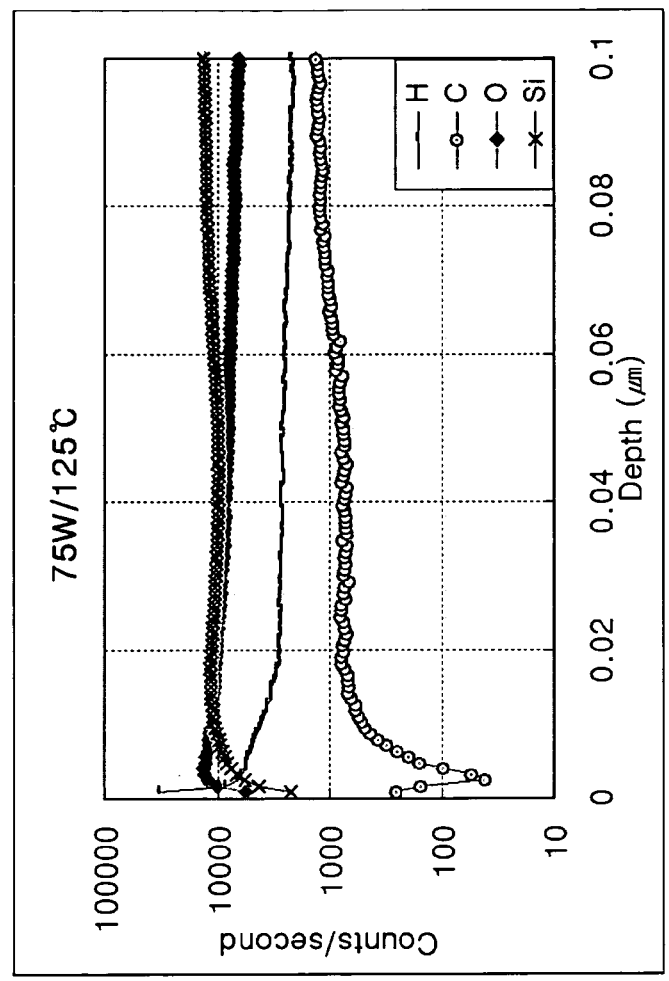
FIGS. 8A and 8B are respective micrographs of TEM and SIMS obtained when a chamber temperature is approximately 125° C. while a bias power of the inner chamber is maintained at approximately 75 W in accordance with the present invention.
Figure 8A:
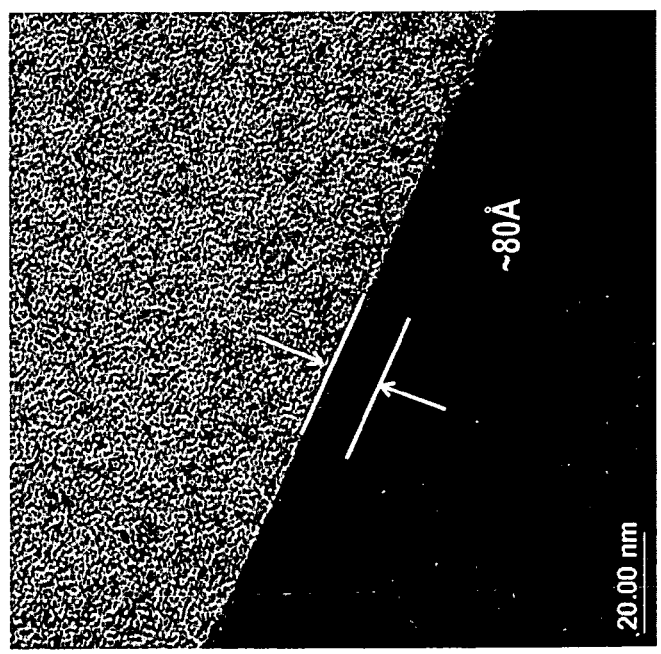
Figure 9A:
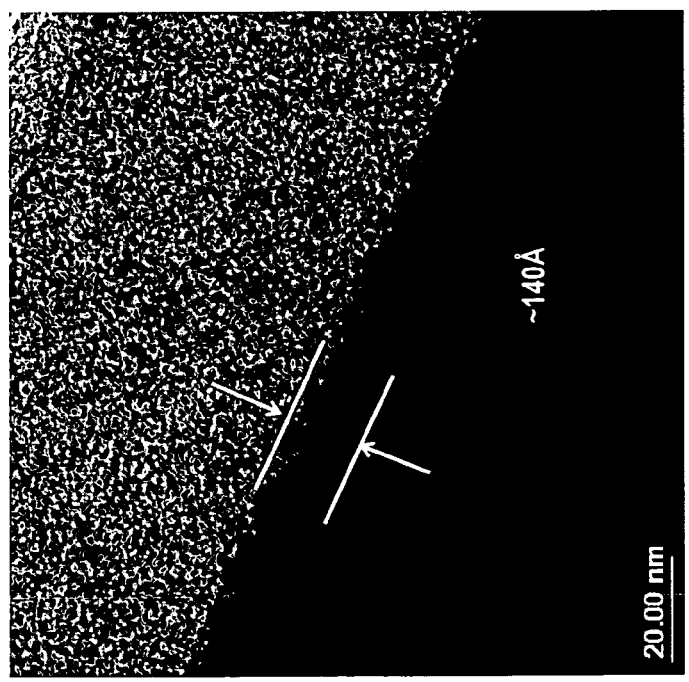
FIGS. 9A and 9B are respective micrographs of TEM and SIMS obtained when a chamber temperature is approximately 150° C. while a bias power of the inner chamber is maintained at approximately 75 W in accordance with the present invention.
Figure 9B:
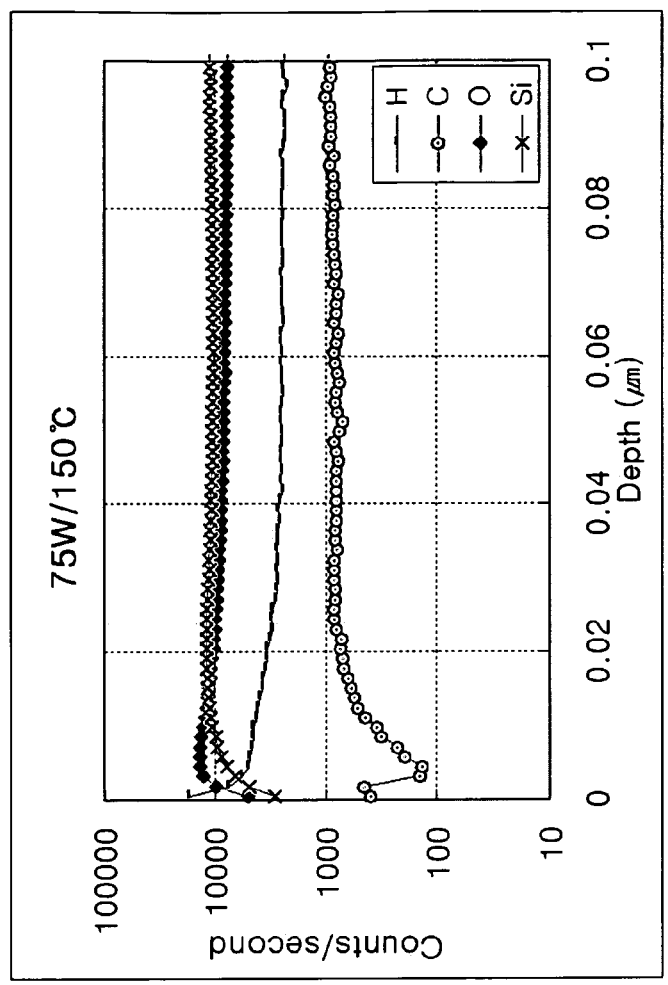

FIGS. 7A to 7B are respective micrographs of TEM and SIMS obtained when a chamber temperature is approximately 100° C. while the bias power of the inner chamber is maintained at approximately 75 W. Also, FIGS. 8A to 8B are respective micrographs of TEM and SIMS obtained when the chamber temperature is approximately 125° C. while the bias power of the inner chamber is maintained at approximately 75 W. Further, FIGS. 9A and 9B are respective micrographs of TEM and SIMS obtained when the chamber temperature is approximately 150° C. while the bias power of the inner chamber is maintained at approximately 75 W.

Especially, as shown in FIG. 7A, when the chamber temperature is set approximately 100° C., an oxidized thickness of the OSG layer is approximately 30 Å. However, as shown in FIG. 8A, when the chamber temperature increases to 125° C., an oxidized thickness of the OSG layer is approximately 80 Å. Further, when the chamber temperature reaches approximately 150° C. as shown in FIG. 9A, an oxidized thickness of the OSG layer is approximately 140 Å. On the basis of these analysis results, the oxidation degree of the OSG layer has a proportional relationship with the chamber temperature.

Figure 10A:
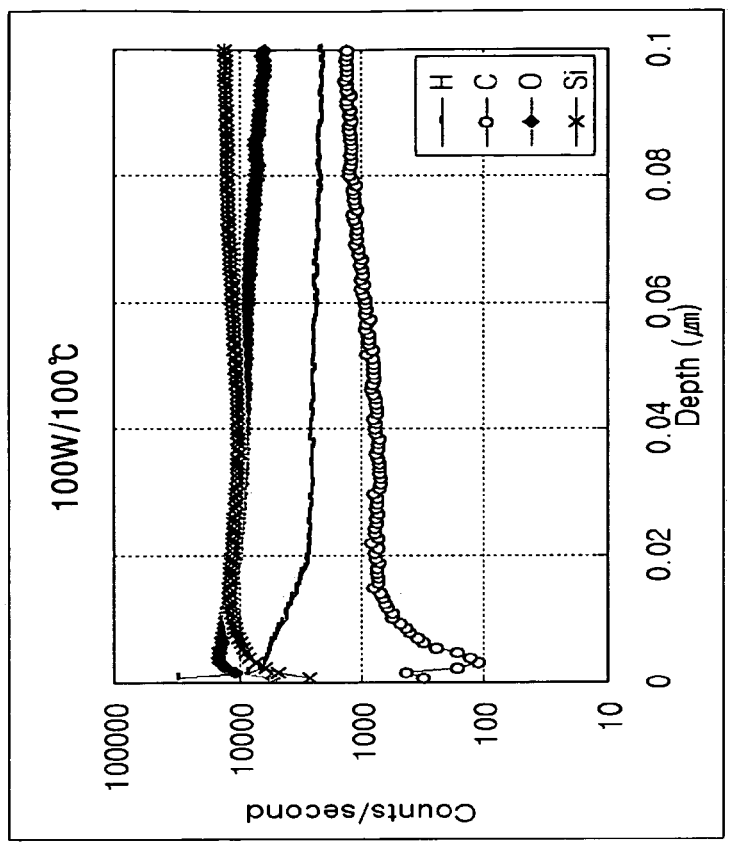
FIGS. 10A and 10B are respective micrographs of TEM and SIMS obtained when a chamber temperature is set at approximately 100° C. while a bias power of the inner chamber is maintained at approximately 100 W in accordance with the present invention.
Figure 10B:
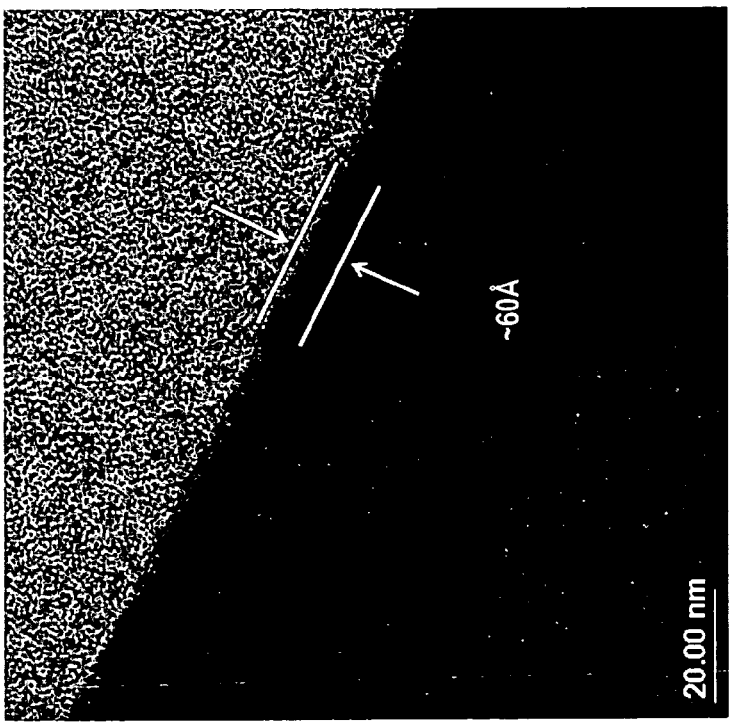
Figure 11B:
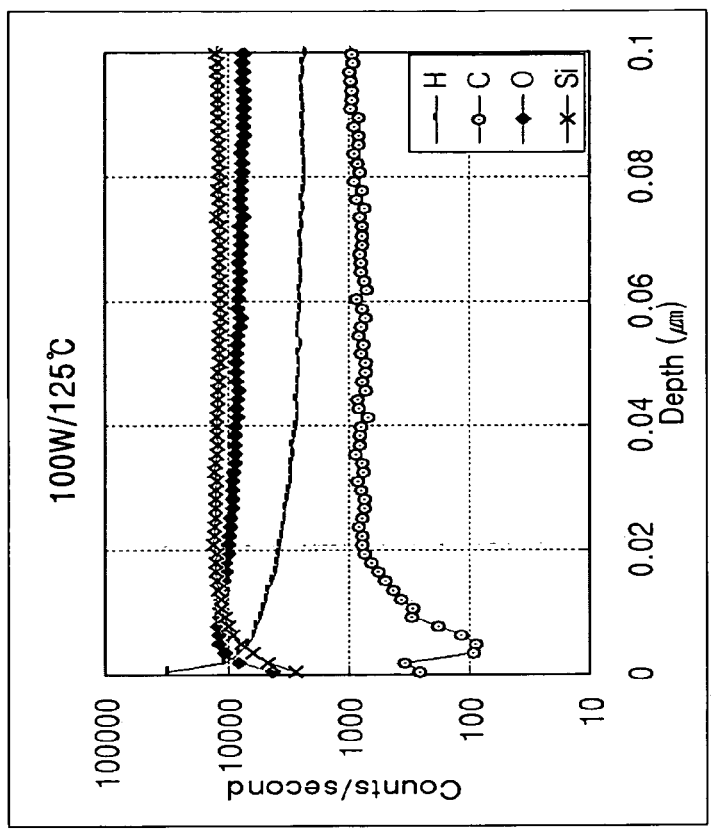
FIGS. 11A and 11B are respective micrographs of TEM and SIMS obtained when a chamber temperature is set at approximately 125° C. while a bias power of the inner chamber is maintained at approximately 100 W.
Figure 11A:
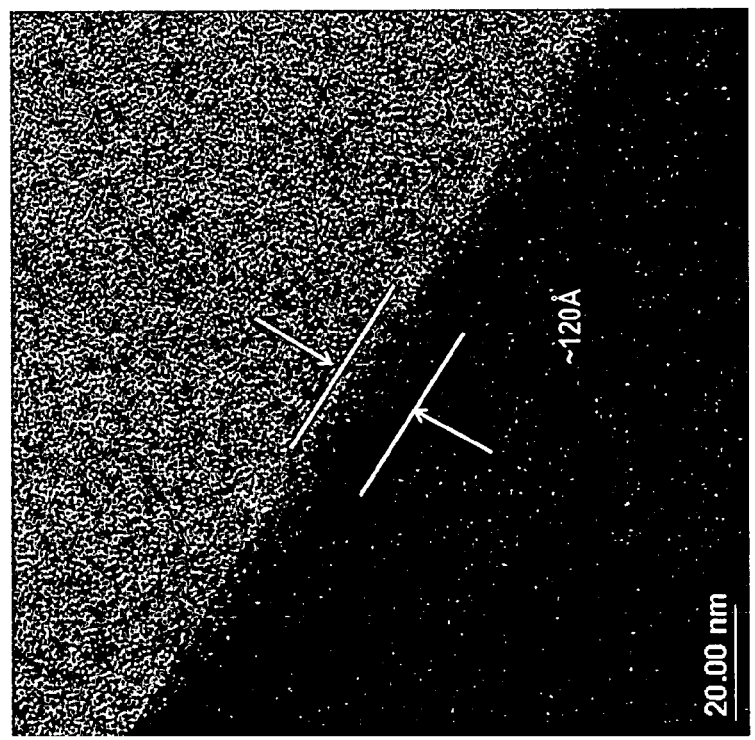
Figure 12B:
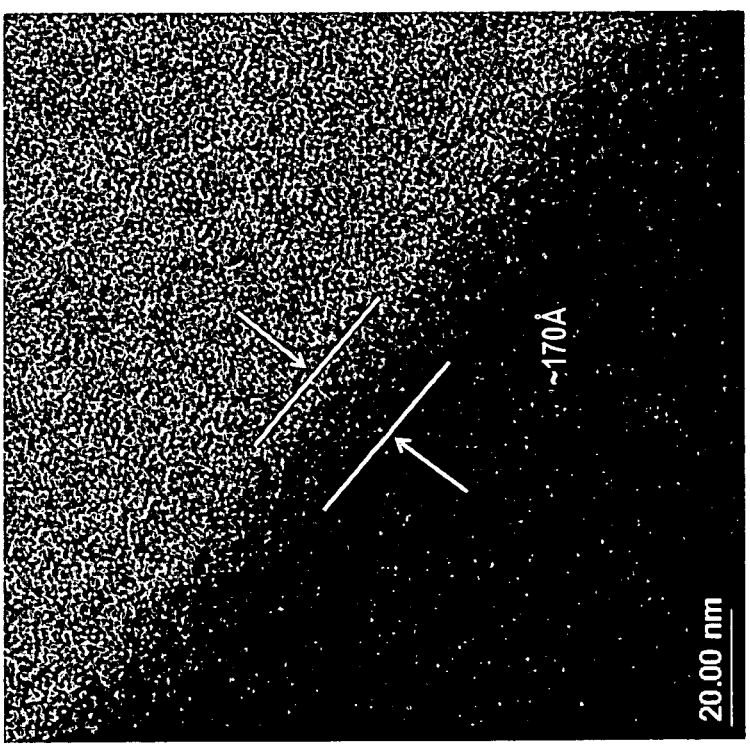
FIGS. 12A and 12B are respective micrographs of TEM and SIMS obtained when a chamber temperature is set at approximately 150° C. while a bias power of the inner chamber is maintained at approximately 100 W in accordance with the present invention.
Figure 12A:
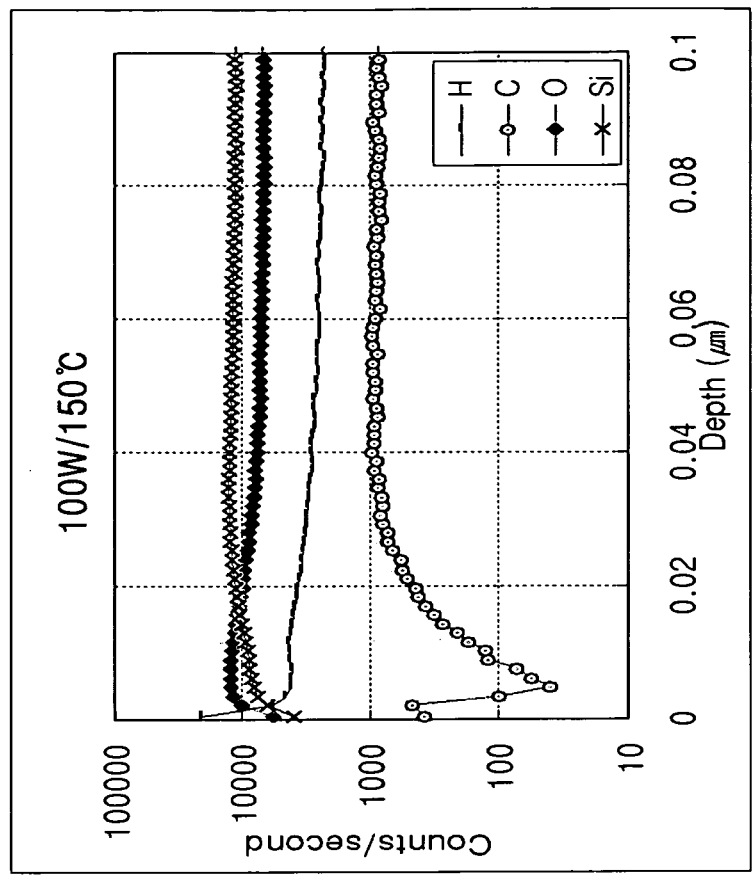

FIGS. 10A and 10B are respective micrographs of TEM and SIMS obtained when a chamber temperature is set at approximately 100° C. while the bias power of the inner chamber is maintained at approximately 100 W. FIGS. 11A and 11B are respective micrographs of TEM and SIMS obtained when a chamber temperature is set at approximately 125° C. while the bias power of the inner chamber is maintained at approximately 100 W. FIGS. 12A and 12B are respective micrographs of TEM and SIMS obtained when a chamber temperature is set at approximately 150° C. while the bias power of the inner chamber is maintained at approximately 100 W.

Especially, as shown in FIG. 10A, when the chamber temperature is approximately 100° C., an oxidized thickness of the OSG layer is 60 Å. As the chamber temperature increases to approximately 125° C., an oxidized thickness of the OSG layer is approximately 120 Å as shown in FIG. 11A. Further, when the chamber temperature increases to approximately 150° C., an oxidized thickness of the OSG layer is approximately 170 Å. On the whole, these analysis results indicate that the oxidation degree of the OSG layer increases as the chamber temperature and the bias power increase.

Hereinafter, a second embodiment of the present invention in regards of a method for forming a metal line by employing the above described photoresist removal method will be described in detail with reference to FIGS. 13A to 13G.

Figure 13A:
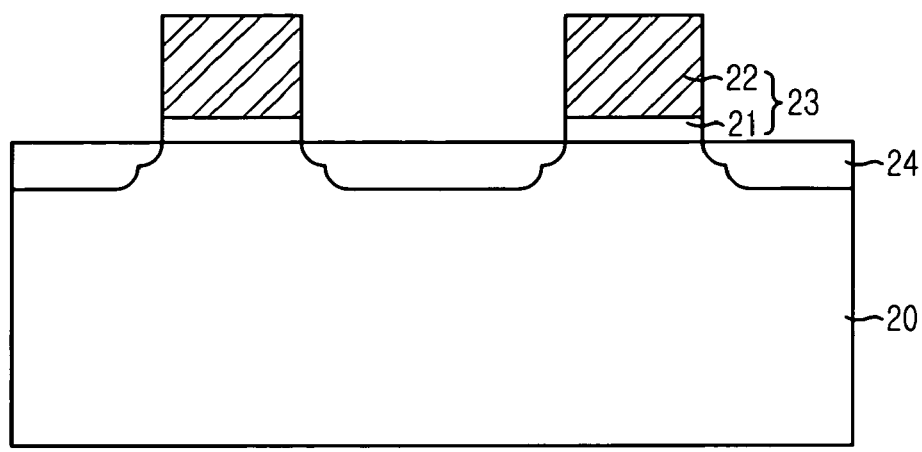
FIGS. 13A to 13G are cross-sectional views illustrating a method for forming a metal line in accordance with a second embodiment of the present invention.

Referring to FIG. 13A, a substrate 20 precedently cleaned by a cleaning process is provided. The cleaning process can be carried out by using a solution of diluted hydrofluoric (HF) acid and subsequently a mixture solution of ammonium hydroxide ($NH_4OH$), $H_2O_2$ and $H_2O$, which is called SC-1 solution, or first using buffered oxide etchant (BOE) and then the SC-1 solution.

Next, although not illustrated, a well ion implantation process and a threshold ion implantation process are carried out to form a well region and a threshold ion implantation region. At this time, a screen oxide layer can be formed on the substrate 20 before the performance of the well ion implantation process and the threshold ion implantation process in order to prevent the substrate 20 from being damaged.

Then, a gate insulation layer 21 is formed on the substrate 20. At this time, the gate insulation layer 21 can be formed through a wet oxidation process and an annealing process. Also, oxide is one exemplary material for the gate insulation layer 21. A polysiliocn layer 22 is then formed on the gate insulation layer 21 by employing a low pressure chemical vapor deposition (LPCVD) method. For the LPCVD method, $PH_3$ gas and one selected from silane ($SiH_4$) gas and disilane ($Si_2H_6$) gas are used.

Afterwards, the polysilicon layer 22 and the gate insulation layer 21 are sequentially etched by employing photolithography, thereby forming a plurality of gate structures 23. Then, a plurality of source/drain regions 24 are formed in portions of the substrate 20 exposed on sidewalls of the gate structures 23 by performing a source/drain ion implantation process. Herein, the source/drain regions can be formed to include lowly doped junction regions and highly doped junction regions.

Although not illustrated, a metal-based silicide layer can be formed on the source/drain regions 24 and the gate structures 23. At this time, the metal-based silicide layer can be formed by employing a metal selected alone or in combination from a group consisting of Co, Ti and Ni.

Figure 13B:
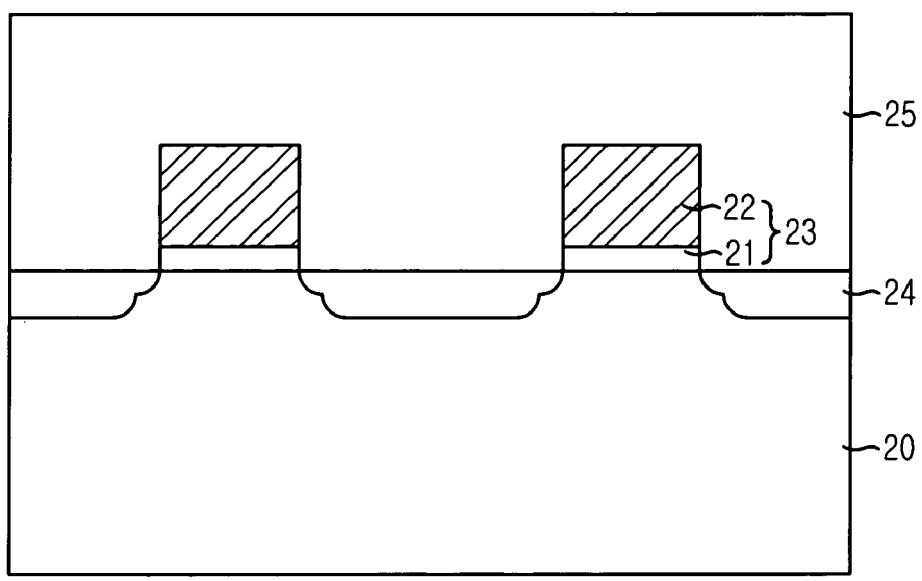

Referring to FIG. 13B, a poly-metal dielectric or pre-metal dielectric (PMD) layer, or an inter-layer dielectric (ILD) layer is formed on the above resulting substrate structure. Herein, a reference numeral 25 denotes one of these mentioned layers, and hereinafter, the reference numeral 25 will be referred to as a first inter-layer insulation layer. It is preferable to employ a low-k dielectric material of which dielectric constant (k) is in a range from approximately 1.8 to approximately 5.0 by considering RC delay in a device. The first inter-layer insulation layer 25 can be also formed by employing a silicon oxide (SiO) or silicon dioxide ($SiO_2$)-based layer locally including a substitutional or interstitial substance such as F, H, C, $CH_3$, Si, P, or the like. At this time, the composition of SiO or $SiO_2$ has a dielectric constant ranging from approximately 1.5 to approximately 4.5. For instance, examples of such SiO or $SiO_2$-based layer are a borophosphosilicate (BPSG) layer, a phosphosilicate glass (PSG) layer, a plasma enhanced tetraethylorthosilicate (PETEOS) layer, an undoped silicate glass (USG) layer, a fluorinated silicate glass (FSG) layer, a carbon doped oxide (CDO) layer and an OSG layer. The first inter-layer insulation layer 25 is then planarized by performing a chemical mechanical polishing (CMP) process.

Figure 13C:
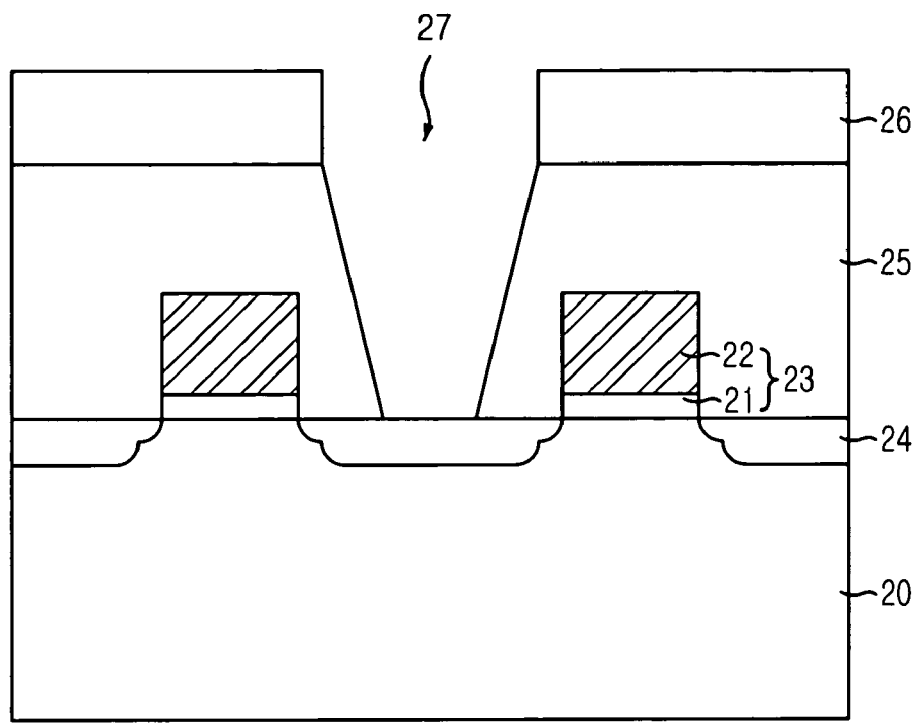

Referring to FIG. 13C, a photoresist layer for forming a contact hole 27 is formed and patterned by employing a photo-exposure process and a developing process, thereby forming a photoresist pattern 26. The first inter-layer insulation layer 25 is then etched by using the photoresist pattern 26 as an etch mask. As a result of this etching process, the aforementioned contact hole 27 exposing one of the source/drain regions 24 is formed.

Figure 13D:
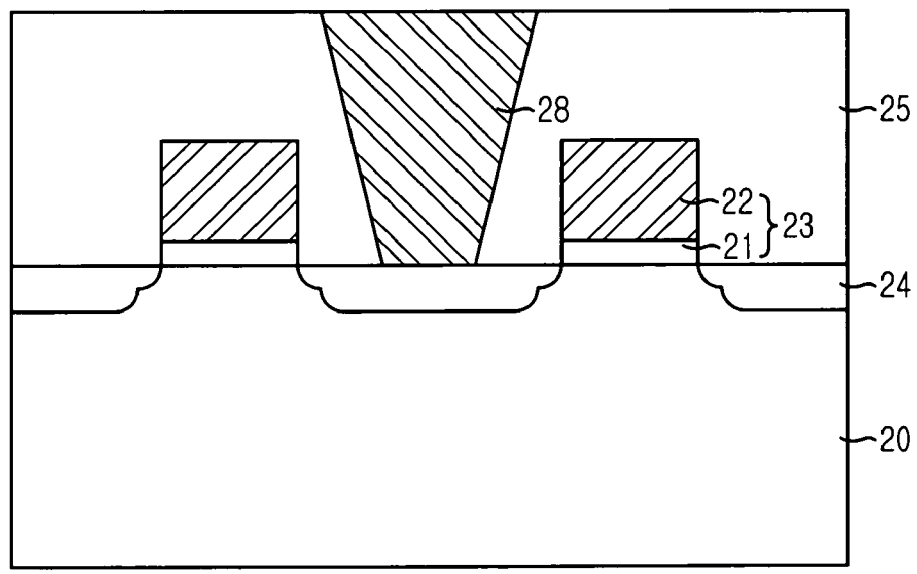

Referring to FIG. 13D, a photoresist strip process for removing the photoresist pattern 26 is carried out after the formation of the contact hole 27. Herein, the photoresist strip process can be carried out under the same recipe employing the HDP apparatus as described in the first embodiment of the present invention.

Meanwhile, in the second embodiment of the present invention, instead of an electric field, a magnetic field can be applied to attract $O_x$ ions, where x ranges from approximately 1 to approximately 3, in one direction. In this case, the magnetic field preferably ranges from approximately 0 Gauss to approximately 200 Gauss and, employing this magnetic field provides an effect of enhancing strip efficiency.

Afterwards, a metal layer is formed such that the metal layer fills the contact hole 27 and then, subjected to a CMP process which results in formation of a plug 28. At this time, the metal layer for forming the plug 28 is selected from a group consisting of aluminum (Al), tungsten (W) and copper (Cu). In case of employing the Cu, stacked layers of Ti and TiN are formed between the contact hole 27 and the plug 28. At this time, the stacked layers of Ti and TiN functions as a barrier layer for preventing diffusion of Cu atoms.

Figures 13E, 13F:
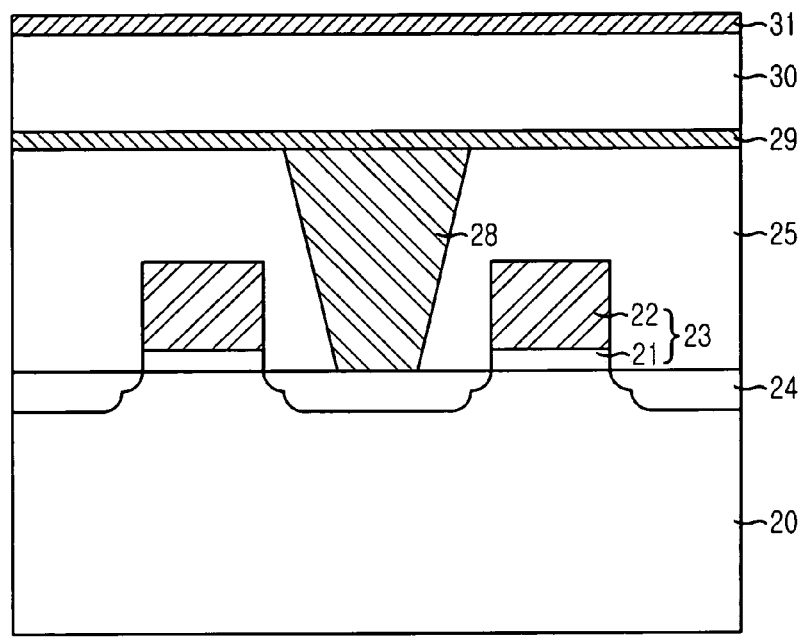

Referring to FIG. 13E, a diffusion barrier layer 29 is formed on the plug 28 and the first inter-layer insulation layer 25. At this time, the diffusion barrier layer 29 has a thickness ranging from approximately 150 Å to approximately 1,000 Å. Also, the diffusion barrier layer is formed in a single layer based on a material selected from a group consisting of SiC, SiN, SiON, Ta, TaN, TaC, TaAlN, TaSiN, $TaSi_2$, Ti, TiN, TiSiN, WN, WBN, WC, Co and $CoSi_2$, or in a stack structure including at least more than two materials therefrom. Further, the diffusion barrier layer 29 is formed through one of a physical vapor deposition (PVD) method, a chemical vapor deposition (CVD) method and an atomic layer deposition (ALD). The diffusion barrier layer 29 serves a role in preventing diffusion of Cu atoms during a dual damascene process employed for a metal line formation process using Cu.

Next, on the diffusion barrier layer 29, a second inter-layer insulation layer 30 is formed in a thickness ranging from approximately 1,000 Å to approximately 3,000 Å. The second inter-layer insulation layer 30 is formed by employing the same material used for the first inter-layer insulation layer 25 or OSG. Afterwards, a CMP process is performed to planarize the second inter-layer insulation layer 30.

Although not illustrated, a third inter-layer insulation layer can be formed on the second inter-layer insulation layer 30. At this time, the third inter-layer insulation layer can be formed with the same material used for the first inter-layer insulation layer 25 or TEOS. The third inter-layer insulation layer has a thickness ranging from approximately 300 Å to approximately 2,000 Å. In addition, a CMP process can be performed to planarize the third inter-layer insulation layer.

Subsequently, a capping layer or anti-reflective coating layer 31 is formed. In case of the capping layer, a material is selected from a group consisting of $SiO_2$, SiC, SiN ($Si_3N_4$), SiOC, SiOCH, and SiON. In case of the anti-reflective coating layer, an organic material is used, and a thickness of the anti-reflective coating layer is in a range from approximately 200 Å to approximately 1,600 Å.

Referring to FIG. 13F, a photoresist layer is formed on the capping layer or anti-reflective coating layer 31 and then, patterned by performing a photo-exposure process and a developing process with use of a photo-mask, thereby forming a photoresist pattern 32.

With use of the photoresist pattern 32 as an etch mask, the capping layer or anti-reflective coating layer 31, the second inter-layer insulation layer 30 and the diffusion barrier layer 29 are sequentially etched, forming a via hole 33 exposing the plug 28. Herein, the etching process is preferably carried out by employing a dual damascene process. At this time, the etching process proceeds in a dry type and uses a main etch gas selected from a family of $C_xH_yF_z$, where x, y and z each representing an atomic ratio is 0 or a natural number. Such gases as $O_2$, $N_2$, Ar and He are added to the main etch gas. Meanwhile, the diffusion barrier layer 29 can serve as an etch stop layer. In this case, the diffusion barrier layer 29 remains during the etching process, and a remaining portion of the diffusion barrier layer 29 is removed through a subsequent cleaning process.

Figure 13G:
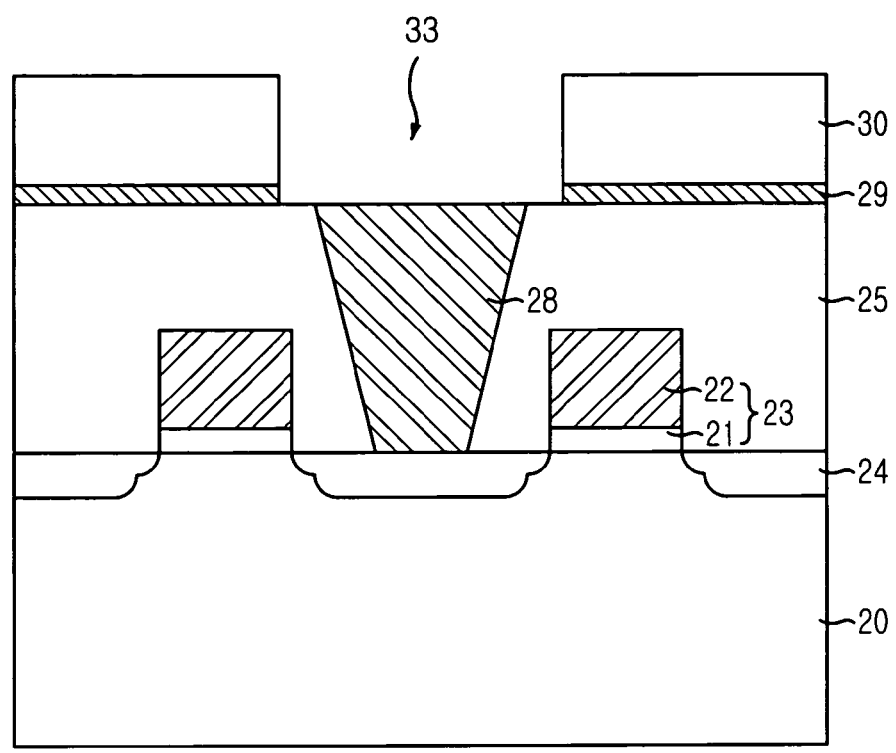

Referring to FIG. 13G, the photoresist pattern 32 show in FIG. 13F is removed through a photoresist strip process. At this time, the strip process is carried out under the same recipe described in the first embodiment.

In addition, instead of employing the HDP apparatus, a separate apparatus for the photoresist strip process is used to remove the photoresist pattern 32, and then, a wafer in which the photoresist pattern 32 is loaded into the HDP apparatus. By the HDP apparatus for the HDP etching, those remnants that are produced during the removal of the photoresist pattern 32 and glued to inner walls of the via hole 33 are possibly removed. It is preferable to perform the HDP etching under the condition of a low pressure and a low temperature below approximately 200° C. in order to minimize oxidation of the second inter-layer insulation layer 30, which is a low-k dielectric layer.

Subsequently, the capping layer or anti-reflective coating layer 31 shown in FIG. 13F is removed. Typically, the anti-reflective coating layer 31 is automatically removed while the photoresist pattern 32 is removed, thereby eliminating a need of an additional removal process.

Although not illustrated, a barrier layer is formed on the second inter-layer insulation layer 30 and into the via hole 33 by employing one of a PVD method, a CVD method and an ALD method. The barrier layer is formed in a single layer by using a material selected from a group consisting of SiC, SiON, Ta, TaN, TaC, TaAlN, TaSiN, $TaSi_2$, Ti, TiN, TiSiN, WN, WBN, WC, Co and $CoSi_2$ or in a stack structure including at least more than two materials therefrom. Preferably, the barrier layer is formed in a stack structure including a Ti layer and a TiN layer. In case of a copper line, the Ti layer acts as a glue layer, while the TiN layer acts as a diffusion barrier layer for preventing diffusion of Cu atoms.

Afterwards, a metal (not shown) is formed on the second inter-layer insulation layer 30 and into the via hole 33. At this time, the metal is selected from a group consisting of Al, platinum (Pt), palladium (Pd), rubidium (Ru), strontium (St), rhadium (Rh), cobalt (Co) and Cu. Preferably, Cu is used.

Although not illustrated, a planarization process such as a CMP process or an etch-back process is performed to form a metal line. For the etch-back process, an etch gas including a halogen gas, for instance, $SF_6/Cl_2/BCl_3$, is used as a main etch gas, and such gas as $O_2$, $N_2$, Ar or He is added to the main etch gas.

Figure 14:
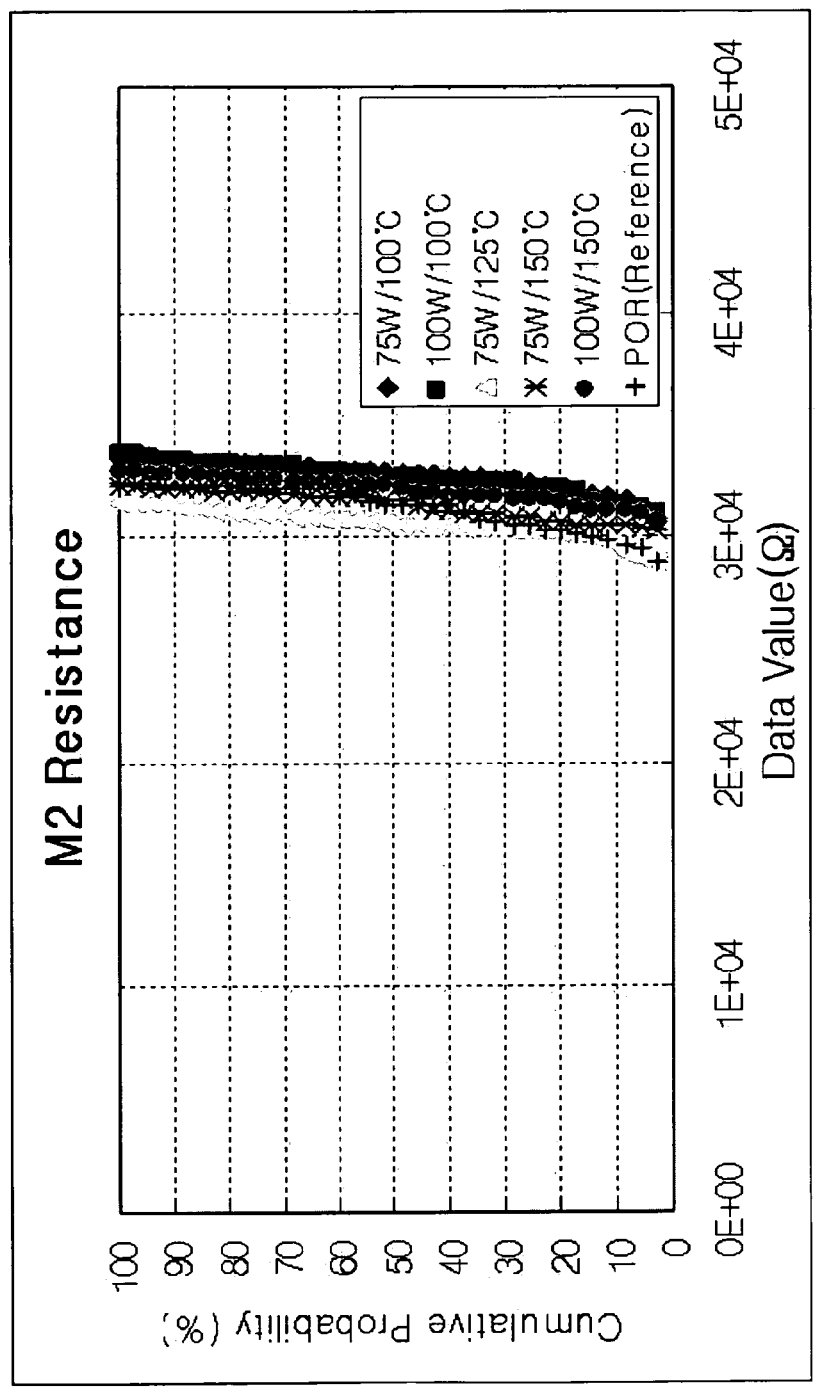
FIG. 14 is a cumulative graph showing a distribution of resistance of a copper (Cu) line depending on parameters during a photoresist strip process in accordance with the present invention.
Figure 15:
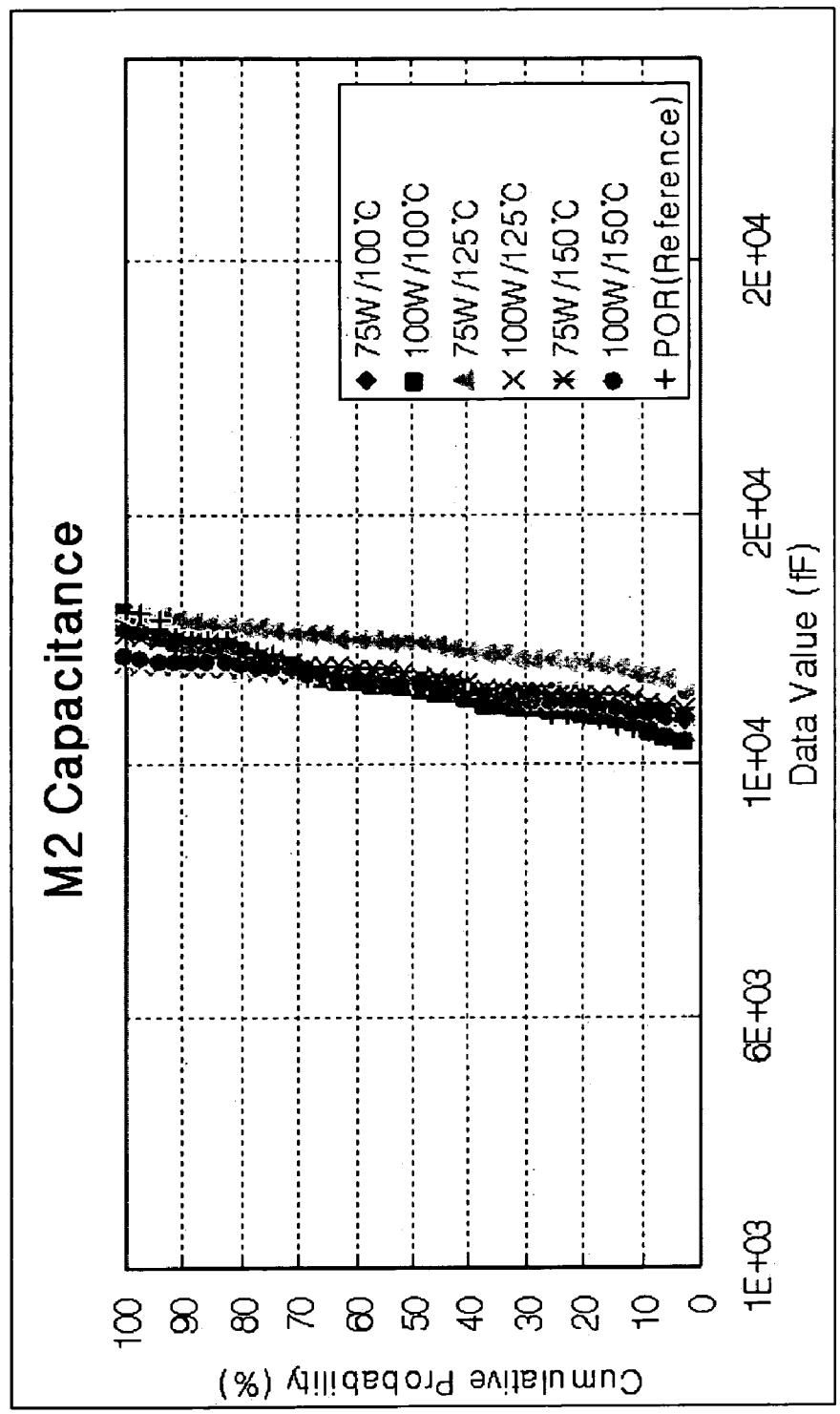
FIG. 15 is a cumulative graph showing a distribution of capacitance of a serpentine structure including a Cu layer and an OSG layer depending on parameters during the photoresist process in accordance with the present invention.
Figure 16:
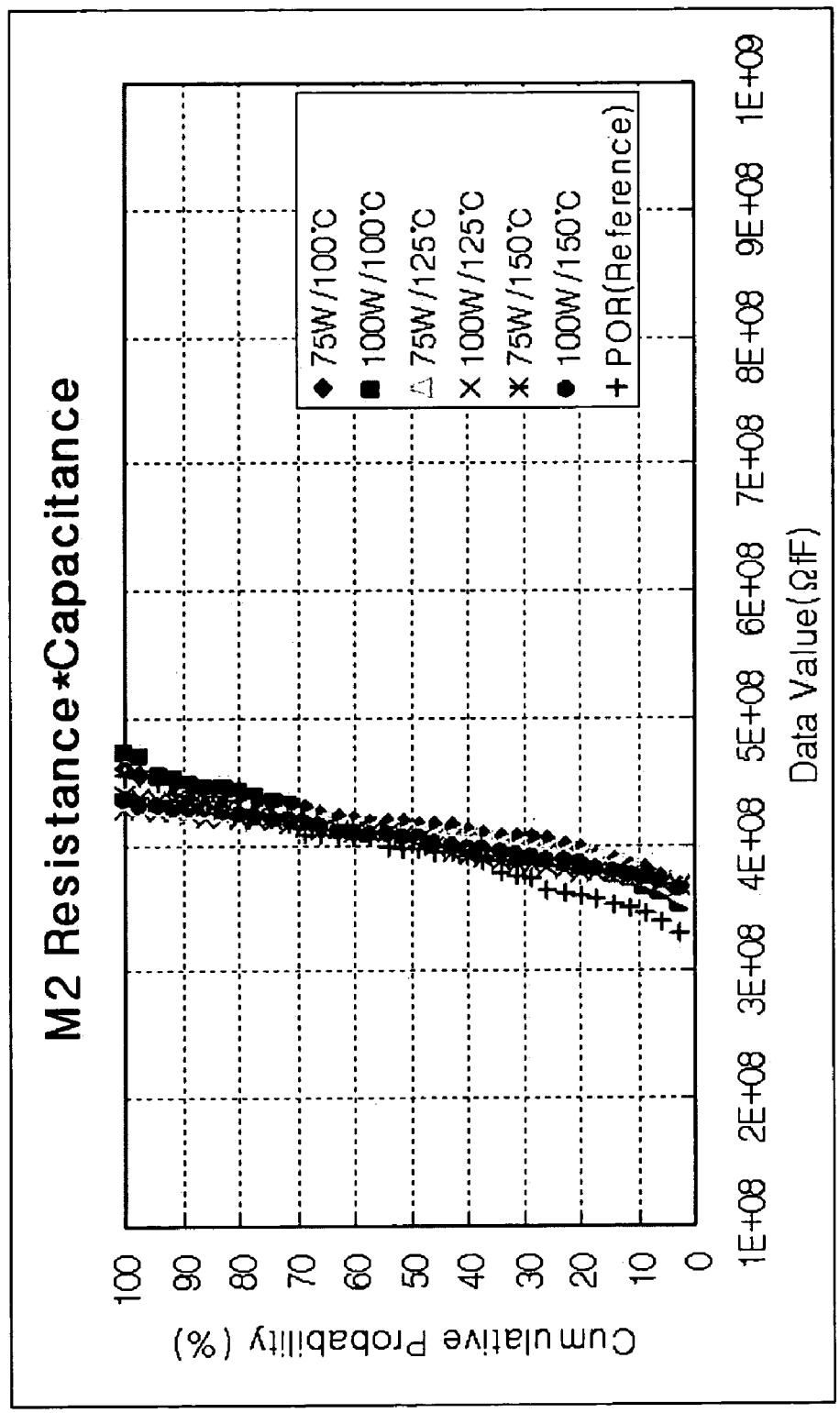
FIGS. 16 is a cumulative graph showing a distribution of resistance and capacitance of a serpentine structure including a Cu layer and an OSG layer depending on parameters during the photoresist strip process in accordance with the present invention.

FIGS. 14 to 16 are cumulative graphs showing distributions of resistance and capacitance depending on parameters like a power and a temperature during a photoresist strip process in accordance with the present invention.

Especially, FIG. 14 shows a distribution of resistance in a copper line with the size of approximately 0.2 μm. FIG. 15 shows a distribution of capacitance of a serpentine structure including a Cu layer and an OSG layer with the sizes of approximately 0.20 μm and approximately 0.21 μm, respectively. At this time, the serpentine structure is formed through a damascene process. FIG. 16 shows a distribution of resistance and capacitance of a serpentine structure including a Cu layer and an OSG layer with the sizes of approximately 0.20 μm and approximately 0.21 μm, respectively. Herein, the serpentine structure is also formed through employing a dual damascene process.

In addition to the application of the present invention to the etching process and the metal line process, the first embodiment and the second embodiment of the present invention can be applied to a process for removing a photoresist pattern used as a mask during an ion implantation process. Furthermore, according to the first embodiment and the second embodiment, an incidence of etch-stop can arise because of carbon-based polymers when the dual damascene process is performed on the OSG-based inter-layer insulation layers. Also, the present invention can be applied as a method for preventing the etch-stop incidence by removing the carbon-based polymers in a vertical direction, while an incidence of oxidation is reduced in a horizontal direction.

On the basis of the first embodiment and the second embodiment of the present invention, it is possible to improve efficiency on the photoresist removal as simultaneously as to reduce an oxidation reaction between bottom layers formed beneath the photoresist pattern and the added gas such as $O_2$, $H_2$, $N_2$ or the like through removing the photoresist pattern by using the HDP apparatus, which is suitable for a characteristic recipe of a low temperature below approximately 200° C. during the photoresist strip process. Thus, the oxidation rate of the bottom layers during the photoresist strip process is reduced, resulting in an increase in semiconductor device yields.

The present application contains subject matter related to the Korean patent application No. KR 2004-0103720, filed in the Korean Patent Office on Dec. 9, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for removing a photoresist pattern, comprising the steps of:
    forming a bottom layer on a substrate by using the photoresist pattern as a mask, wherein the bottom layer is a low-k dielectric layer; and
    removing the photoresist pattern with use of a high density plasma (HDP) apparatus by applying a source power ranging from approximately 2,000 W to approximately 2,500 W and a bias power less than approximately 300 W.

2. The method as recited in claim 1, wherein the HDP apparatus is an inductively coupled plasma reactor.

3. The method as recited in claim 1, wherein a temperature of an inner chamber of the HDP apparatus is maintained in a range from approximately −20° C. to approximately 200° C.

4. The method as recited in claim 1, wherein a plasma density of the HDP apparatus ranges from approximately $5 \times 10^8/cm^3$ to $5 \times 10^{13}/cm^3$.

5. The method as recited in claim 1, wherein the photoresist pattern is removed under a pressure ranging from approximately 1 mmtorr to approximately 1,000 mmtorr.

6. The method as recited in claim 1, wherein the photoresist pattern is removed by using a gas containing at least one selected from oxygen ($O_2$), nitrogen ($N_2$) and hydrogen ($H_2$).

7. The method as recited in claim 1, wherein the low-k dielectric layer obtained as one of a silicon oxide (SiO)-based material and a silicon dioxide ($SiO_2$)-based material locally including one of a substitutional substance and an interstitial substance selected from the group consisting of fluorine (F), hydrogen (H), carbon (C), methyl ($CH_3$), silicon (Si) and phosphorus (P).

8. The method as recited in claim 7, wherein the SiO-based material and the $SiO_2$-based material have a dielectric constant ranging from approximately 1.5 to approximately 4.5.

9. The method as recited in claim 1, wherein the HDP apparatus increases a removal rate of the photoresist pattern by attracting plasma ions generated inside the chamber in one direction through using one of an electric field and a magnetic field.

10. The method as recited in claim 9, wherein the magnetic field ranges from approximately 1 Gauss to approximately 200 Gauss.

11. The method as recited in claim 1, wherein the step of removing the photoresist pattern includes the steps of: removing the photoresist pattern; and loading the substrate in which the photoresist pattern is removed into the chamber of the HDP apparatus and performing a HDP dry etching process, thereby removing remnants remaining on the bottom layer during the removal of the photoresist pattern.

12. The method as recited in claim 1, wherein the bottom layer is an impurity-doped layer by performing an ion implantation process.

13. A method for forming a metal line, comprising the steps of:
    preparing a semi-finished substrate including an inter-layer insulation layer;
    forming a photoresist pattern on the inter-layer insulation layer;
    forming an opening by etching the inter-layer insulation layer with use of the photoresist pattern as an etch mask;

removing the photoresist pattern through the use of a high density plasma (HDP) apparatus by applying a source power ranging from approximately 2,000 W to approximately 2,500 W and a bias power less than approximately 300 W; and forming the metal line by filling the opening with a predetermined material.

14. The method as recited in claim 13, wherein the inter-layer insulation layer is formed by employing a low-k dielectric layer obtained as one of a silicon oxide (SiO)-based material and a silicon dioxide ($SiO_2$)-based material locally including one of a substitutional substance and an interstitial substance selected from a group consisting of fluorine (F), hydrogen (H), carbon (C), methyl ($CH_3$), silicon (Si) and phosphorus (P).

15. The method as recited in claim 14, wherein the SiO-based material and the $SiO_2$-based material have a dielectric constant ranging from approximately 1.5 to approximately 4.5.

16. The method as recited in claim 13, further including the step of forming one of a capping layer and an anti-reflective coating layer on the inter-layer insulation layer prior to forming the photoresist pattern.

17. The method as recited in claim 16, wherein the capping layer is based on a material selected from a group consisting of $SiO_2$, SiC, $SiN(Si_3N_4)$, SiOC, SiOCH and SiON and the anti-reflective coating layer is based on an organic material.

* * * * *